United States Patent [19]

Chow

[11] 4,194,800
[45] Mar. 25, 1980

[54] CONNECTOR ASSEMBLY FOR LEADLESS MICROCIRCUIT DEVICE

[75] Inventor: Weichien Chow, Park Forest, Ill.

[73] Assignee: Bunker Ramo Corporation, Oak Brook, Ill.

[21] Appl. No.: 879,905

[22] Filed: Feb. 21, 1978

[51] Int. Cl.² ............................................. H05K 1/12
[52] U.S. Cl. ........................... 339/17 CF; 339/75 MP
[58] Field of Search .......... 339/17 M, 17 LM, 17 CF, 339/75 M, 75 MP

[56] References Cited

U.S. PATENT DOCUMENTS

| | | | |
|---|---|---|---|
| 3,335,327 | 8/1967 | Damon et al. | 339/17 CF |
| 3,940,786 | 2/1976 | Scheingold et al. | 339/17 CF |
| 4,035,046 | 7/1977 | Kloth | 339/17 CF |

FOREIGN PATENT DOCUMENTS 2331891  6/1977  France .

OTHER PUBLICATIONS

IBM Tech. Discl. Bulletin, Kryzaniwsky, vol. 14, No. 10, p. 2911, 3-1972.

*Primary Examiner*—Neil Abrams
*Attorney, Agent, or Firm*—F. M. Arbuckle; W. Lohff

[57]  ABSTRACT

A connector assembly suitable for connecting a leadless integrated circuit device to a circuit board. The circuit device typically has a plurality of flat conductive pads spaced along parallel edges thereof. The circuit board similarly typically has a plurality of flat conductive pads spaced along parallel first and second rows. The connector assembly includes a pair of anchor plates bonded to the circuit board and spaced by a distance just sufficient to accommodate said integrated circuit device therebetween. First and second banks of elongated essentially parallel contacts are fixedly connected, as by solder, to the circuit board pads. When the removable circuit device is placed on the circuit board between the anchor plates, connection from the fixedly connected contact banks to the circuit device pads is made by first and second banks of flexible parallel bridging contacts. The bridging contact banks are placed so as to bridge the space between the fixedly connected contact banks and the circuit device pads. Clamping members are attached to the anchor plates to bear against the bridging contacts to physically secure and electrically connect the circuit device to the circuit board.

14 Claims, 11 Drawing Figures

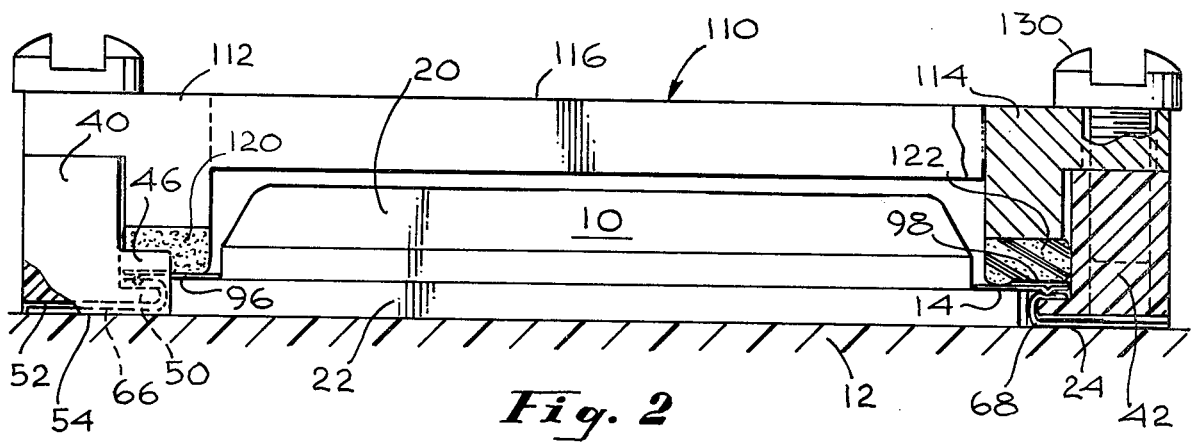
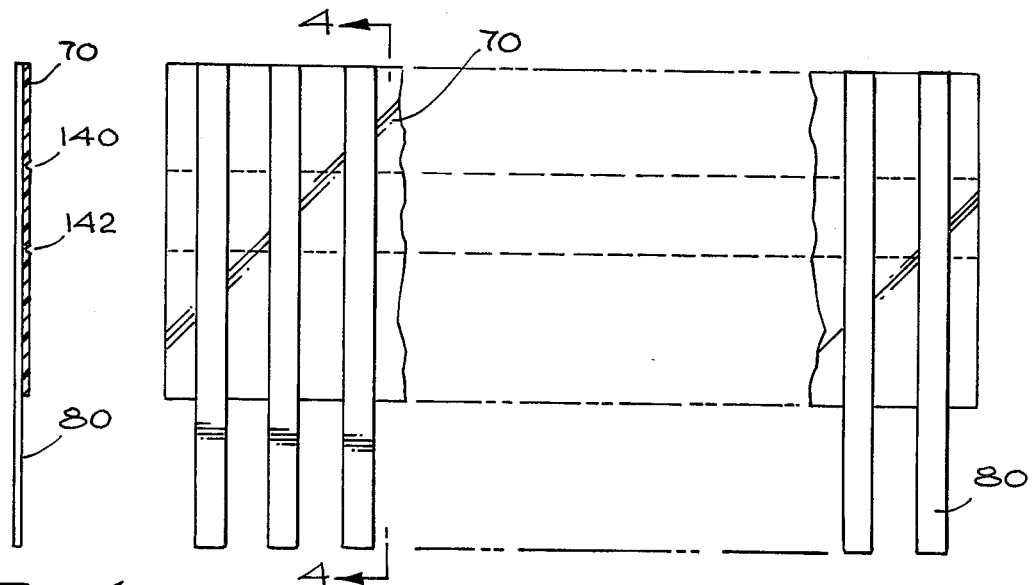
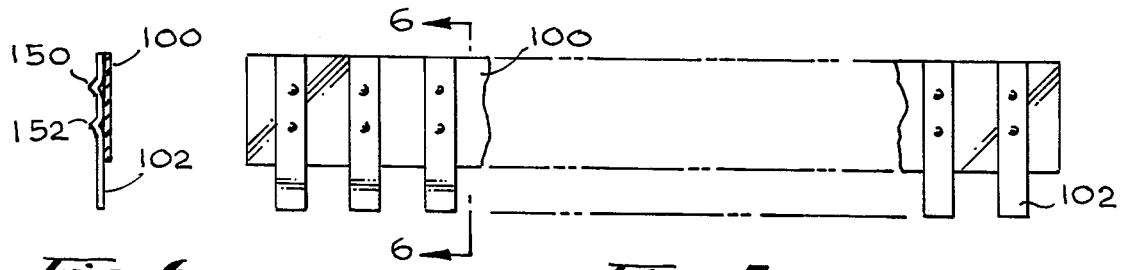

CONNECTOR ASSEMBLY FOR LEADLESS MICROCIRCUIT DEVICE

FIELD OF THE INVENTION

This invention relates generally to electrical connectors and more particularly to a connector assembly suitable for connecting a leadless integrated circuit device to a circuit board.

BACKGROUND OF THE INVENTION

Integrated circuit (microcircuit) devices commonly utilize a construction in which the semiconductor integrated circuit "chip" is mounted upon an insulator base with a plurality of relatively thin electrical connector leads projecting from the base to provide for connection of the device to external circuits. One common construction comprises a dual in-line package in which the leads protrude from the opposite sides of the device and are bent at right angles, in a common direction, to afford mounting pins for the device. For example, twenty leads may extend from each of two opposed sides in a forty-lead microcircuit device. Device packages of this kind have encountered reliability problems due to breaking of the leads during manufacturing, testing and shipping.

In view of the aforementioned problems, leadless microcircuit packages have been developed which eliminate the external leads and instead utilize flat conductive contacts or pads disposed on a common surface along two parallel edges of the insulator base.

SUMMARY OF THE INVENTION

The present invention is directed to a connector assembly suitable for connecting a leadless microcircuit device to a circuit board.

A significant object of the present invention is to provide a connector assembly configured so as to occupy only minimal space on the circuit board and to present a low profile so as to permit multiple circuit boards to be mounted close to one another.

A further object of the invention is to provide a connector assembly configured so as to permit easy disassembly to enable the microcircuit device to be quickly replaced.

A still further object of the invention is to provide a connector assembly which is inexpensive to manufacture yet which affords long-term electrical and mechanical reliability.

In a preferred embodiment of the invention, first and second elongated anchor plates are mounted on the circuit board parallel to one another. The anchor plates are spaced by a distance just sufficient to accommodate a microcircuit device therebetween. First and second fixedly secured banks of contacts are soldered to conductive paths on the circuit board, being physically secured thereto by the anchor plates. First and second banks of bridging contacts are provided to electrically interconnect the microcircuit device contacts to the first and second fixedly secured contact banks. Clamping members are removably attached to the anchor plates to bear against the bridging contact banks to establish electrical connections from the microcircuit device contacts to the fixedly secured contact banks, as well as to physically secure the microcircuit device against the circuit board.

In accordance with a significant aspect of the invention, the connector assembly is configured so as to secure the microcircuit device directly against the circuit board thereby assuring good heat dissipation through the circuit board.

The novel features are set forth with particularity in the appended claims. The invention will best be understood from the following description when read in conjunction with the accompanying drawing.

BRIEF DESCRIPTION OF THE DRAWING

FIG. 2 is a partial sectional view illustrating the microcircuit device and connector assembly of FIG. 1 connected to a circuit board;

FIG. 3 is a plan view of one of the fixedly secured connector banks utilized in the embodiment of FIG. 1;

FIG. 4 is a sectional view taken substantially along the plane 4—4 of FIG. 3;

FIG. 5 is a plan view of one of the banks of bridging contacts utilized in the preferred embodiment of FIG. 1;

FIG. 6 is a sectional view taken substantially along the plane 6—6 of FIG. 5;

DESCRIPTION OF THE PREFERRED EMBODIMENTS

Figure 1:
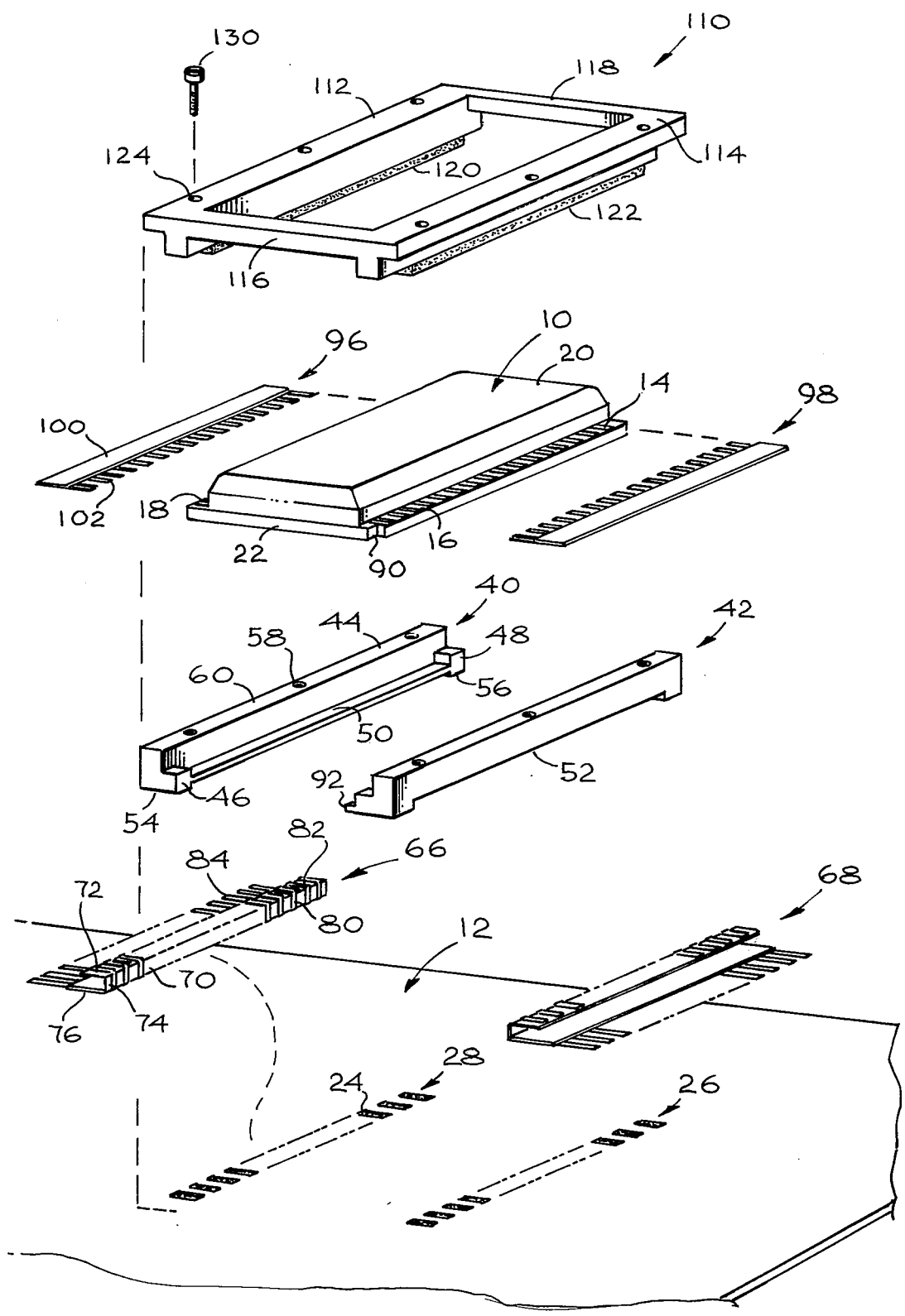
FIG. 1 is an exploded perspective view illustrating a preferred connector assembly embodiment in accordance with the present invention.

Attention is now directed to FIGS. 1 and 2 of the drawing which illustrate a preferred connector assembly embodiment in accordance with the present invention for connecting a leadless microcircuit device 10 to a circuit board 12. Briefly, the device 10 can comprise any of various circuit devices characterized by a package having a plurality of leads which terminate in exposed flat conductive pads 14. Generally, the plurality of pads 14 are disposed along two opposed parallel edges 16, 18 of a common planar surface. More particularly, as can best be seen in FIG. 2, the circuit device 10 is comprised of a cover 20 fixed to a base of insulative material 22. An active circuit chip (not shown) is generally supported on the insulative base and protected by the cover 20. Leads from the chip are brought out to the conductive paths 14 formed on the edges 16 and 18 of the upper surface of the insulative base 22. The circuit board 12 has flat conductive pads 24 formed on the surface thereof. Typically, as is shown in FIG. 1, the conductive pads 24 are arranged along first and second rows 26 and 28. The present invention is directed to a connector assembly for physically securing the microcircuit device 10 directly against the circuit board 12 and for electrically connecting the microcircuit leads or pads 14 to the conductive pads 24 of the circuit board 12.

The connector assembly in accordance with the present invention is comprised of first and second anchor plates 40, 42. Since the anchor plates 40, 42 are essentially identical, only one will be discussed in detail herein.

The anchor plate 40 comprises a block of electrically insulative material, for example formed of glass epoxy. The anchor plate 40 is comprised of a rectilinear block of material 44 having a pair of forwardly extending guide ears 46 and 48. A contact support surface 50 extends between the guide ears 46 and 48. The block 44 is undercut as best shown at 52 to provide solder clearance, as will be more fully understood hereinafter. The anchor plate 40 further includes a pair of bottom surfaces 54 and 56 which are intended to be bonded to the circuit board 12. Threaded holes 58 are formed in the top surface 60 of the block 44 for receiving clamping screws to be discussed hereinafter.

The anchor plates 42 and 44 are bonded to the circuit board 12 inwardly of the rows 26, 28 of conductive pads 24. The anchor plates 42 and 44 are positioned on the circuit board parallel to one another and spaced by a distance just sufficient to accommodate the microcircuit device 10 therebetween.

The connector assembly further includes first and second contact banks 66 and 68. Since the contact banks 66 and 68 are essentially identical, only bank 66 will be referred to in detail. The contact bank 66 is comprised of a sheet of flexible electrically-insulative material 70 formed to define three legs 72, 74, and 76 extending perpendicular to one another. Flat elongated electrically-conductive contacts 80, extending parallel to one another, are formed on the outer surface of sheet 70. Note that the contacts 80 terminate contiguous with a first end 82 of the sheet 70. However, the contacts 80 extend beyond the second end 84 of the sheet 70. As can be seen from FIGS. 1 and 2, the contact bank 66 is formed around anchor plate 40 such that the portion 72 of contact bank sheet 70 rests on the contact support surface 50. The portion 76 of sheet 70 extends beneath the contact support surface 50 immediately adjacent to the upper surface of the circuit board 12. The free ends of contacts 80 extending beyond the end 84 of sheet 70 are fixedly connected, as by soldering, to the pads 24 of pad row 28.

The portions of the connector assembly thus far discussed, that is, the anchor plates 40, 42 and the contact banks 66, 68 are fixedly secured to the circuit board 12 as by bonding and soldering respectively. The remaining elements of the connector assembly to be discussed hereinafter are detachably secured so that the connector assembly can be disassembled to enable the microcircuit device 10 to be replaced.

With the anchor plates 40, 42 and contact banks 66 and 68 secured to the circuit board 12, the microcircuit device 10 is placed therebetween with its bottom surface directly engaging the upper surface of the circuit board 12. This assures good heat transfer from the microcircuit device 10 to the circuit board. Preferably, means are provided for assuring the proper orientation of the microcircuit device relative to the anchor plates. For example, as is shown in FIG. 1, one of the four corners of the microcircuit device 10 is notched as at 90. The anchor plate 42 has a lug 92 extending from one of the guide ears thereof for fitting into the notch 90. As can be seen from FIG. 2, the anchor plates are dimensioned such that the contact support surface 50 is essentially aligned with the microcircuit device conductive pads 14 when the device 10 is installed in the circuit board between the anchor plates. In order to electrically bridge the spacing between the contacts 80 and the microcircuit device pads 14, a pair of bridging contact banks 96, 98 are provided. Since the contact banks 96 and 98 are substantially identical, only contact bank 96 will be discussed in detail. Briefly, it comprises a sheet of flexible electrically-insulative material 100. A plurality of parallel elongated contacts 102 are formed on one surface of the sheet 100. As is best shown in FIG. 2, the contact bank 98 is placed so that the contacts 102 thereof engage the contacts 80 of the fixedly secured contact bank 68 immediately above the contact support surface 50 of anchor plate 42. The contacts 102 of the bridging contact bank 98 extend to and also engage the conductive pads 14 along edge 16 of the microcircuit device 10.

A rectangular clamping frame 110 is provided comprised of clamping members 112, 114 and side rails 116, 118. The clamping members 112, 114 carry blocks of resilient material 120, 122 formed, for example, of silicon rubber which may be bonded to the clamping frame 110. Holes 124 extend through the clamping members 112, 114 in alignment with the holes 58 provided in the upper surfaces 60 of the anchor plates 40, 42. Screws 130 are provided for extending through the holes 124 in the clamping members 112, 114 into the threaded holes 58 in the anchor plates 40, 42. The screws should be tightened sufficiently to cause the clamping frame to bear against the resilient blocks 122 so as to urge the bridging contact banks 96, 98 against both the conductive pads of the microcircuit device 10 and the contacts 80 of the contact banks 66, 68. The screws 130 should provide a sufficient clamping force to hold the microcircuit device 10 firmly against the PC board to prevent any relative movement therebetween such as might be caused by vibration. Further, the clamping force should be sufficient to slightly distort the blocks 120, 122 of resilient material so as to seal the contacts of the four contact banks from adverse environmental effects.

FIGS. 3 and 4 illustrate one of the fixedly secured contact banks 66, 68 in greater detail. The insulative sheet 70 is preferably formed of material such as 3 mil polyimide. The elongated contacts 80 are preferably formed of three-ounce copper plated with a very thin layer of gold. As can be best seen in FIG. 4, the thickness of the insulative sheet 70 is reduced at points 140 and 142 to thus permit the sheet 70 to be folded along these lines into the configuration shown in FIGS. 1 and 2 for fitting around the anchor plates 40, 42. In a typical connector assembly for accommodating a microcircuit device 10 having thirty-seven conductive pads along each edge, the polyimide insulative sheet 70 will have a width of approximately 0.220 inches and a length of approximately 1.850 inches. The width of a typical elongated contact would be 0.020 inches with approximately 0.030 inches spacing being provided between adjacent contacts.

FIGS. 5 and 6 illustrate the bridging contact banks 96, 98 in greater detail. Again, the insulative sheet 100 is preferably formed of 3 mil polyimide with the elongated contacts 102 being formed of 2–3 ounce copper plated with a very thin layer of gold. Preferably, a pair of raised conductive areas or dimples 150, 152 are formed on each contact 102. Typically, the dimples will have a height of about 0.003 inches and a diameter of about 0.005 inches. The polyimide sheet 100 may have a width of 0.070 inches and a length equal to 1.850 inches corresponding to the length of the fixedly secured contact bank sheets. The width of the contacts 102 and the spacing between the contacts of course corresponds with the spacing previously mentioned with respect to the fixedly secured contact banks 66, 68. Whereas the length of the contacts 80 of the fixedly secured contact banks is typically on the order of 0.320 inches, the length of the bridging contact bank contacts 102 is typically on the order of 0.120 inches.

In use, when the clamping frame 110 is tightened down toward the anchor plates 40, 42, the dimples 150, 152 on the bridging contacts 102 will engage the fixedly secured contacts 80. Due to the relatively soft gold plating on the dimples, the clamping force will typically cause the maleable dimples to somewhat deform to assure good electrical contact between the bridging contacts 102 and the fixedly secured contacts 80.

Figure 7:
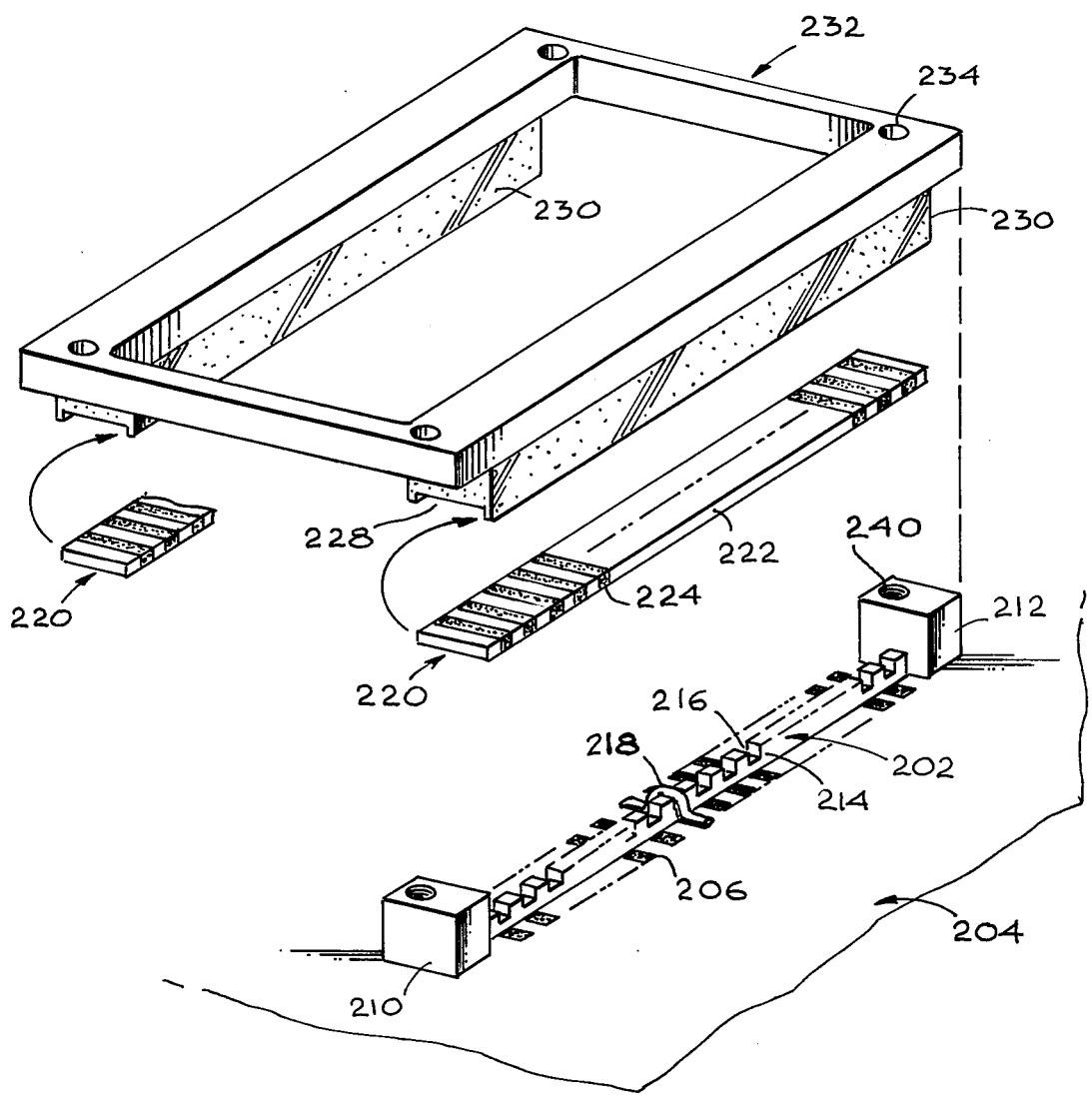
FIG. 7 is an exploded perspective view of an alternate embodiment of the invention.
Figure 8:
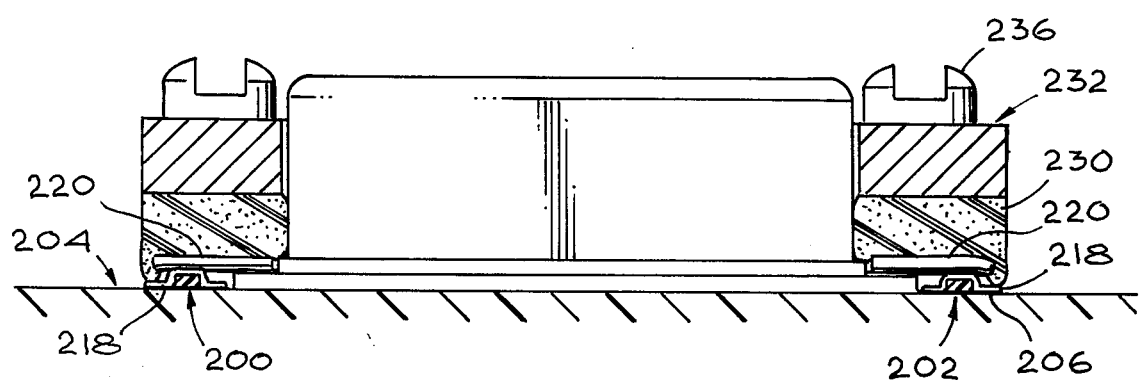
FIG. 8 is a partial sectional view illustrating the microcircuit device and connector assembly of FIG. 7 connected to a circuit board.

Attention is now called to FIGS. 7 and 8 which illustrate an alternate embodiment of the invention. In the embodiment of FIGS. 7 and 8, anchor plates 200 and 202 are bonded to the circuit board 204 immediately above conductive paths 206 formed on the circuit board 204. Each anchor plate 202, 204 is comprised of a pair of end blocks 210, 212, connected by a bar 214. The bar 214 is provided with a series of guideways 216 therealong, each guideway being provided to accommodate a U-shaped contact 218. The contacts 218 are fixedly connected, as by soldering, to the conductive pads on the circuit board which they overlie. Thus, the contacts 218 being fixedly connected to the circuit board conductive pads correspond to the contacts 80 previously discussed in the embodiment of FIGS. 1 and 2.

In lieu of the bridging contact banks illustrated in the embodiment of FIGS. 1 and 2, FIGS. 7 and 8 illustrate a bridging contact bank 220 comprising an elastomer wafer 222 having conductive paths 224 deposited thereon. The bridging contact bank 220 comprised of the elastomer wafer 222 can be mounted in a recess 228 defined in blocks 230 of resilient material carried by a clamping frame 232. More particularly, the blocks 230 may be formed of silicon rubber recessed at 228 to receive the elastomer wafer 222 with the conductive leads thereon faced downwardly toward the anchor plates.

The clamping frame 232 is provided with holes 234 for receiving screws 236 therethrough which screws fit into threaded holes 240 formed in the end of blocks 210, 212 of the anchor plates 200, 202. When the screws 236 are tightened, the clamping plate forces the bridging contact bank 220 against both the U-shaped fixedly secured contacts 218 and the conductive pads on the edges of the microcircuit device. Thus, electrical connections between the microcircuit device and the circuit board conductive pads are created and the device is secured directly against the circuit board.

Figure 9:
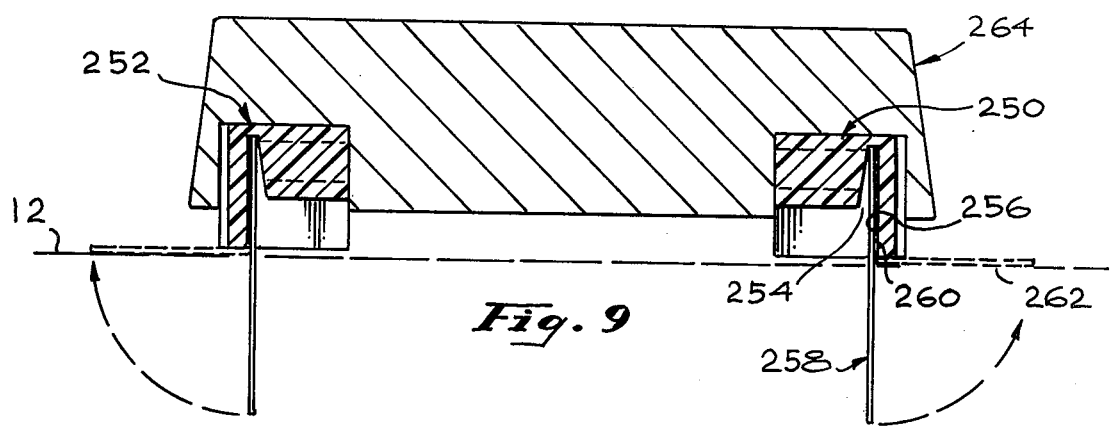
FIG. 9 is a sectional view showing one stage in the installation of a connector assembly in accordance with another embodiment of the invention.
Figure 10:
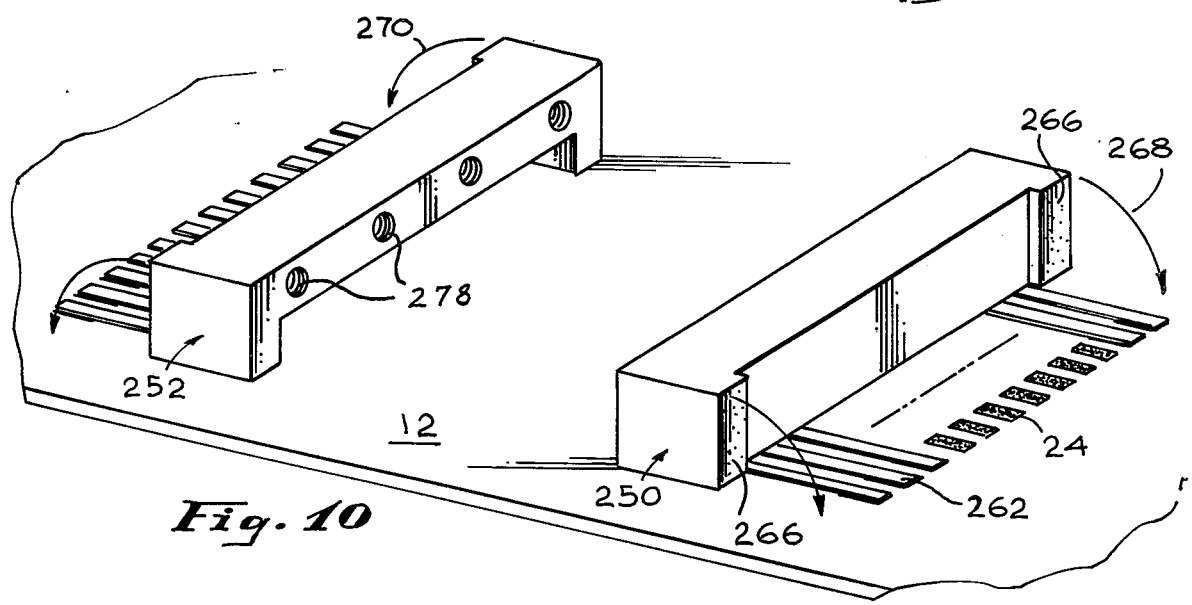
FIG. 10 is a perspective view of the connector assembly of FIG. 9, shown at a later stage in the installation process.
Figure 11:
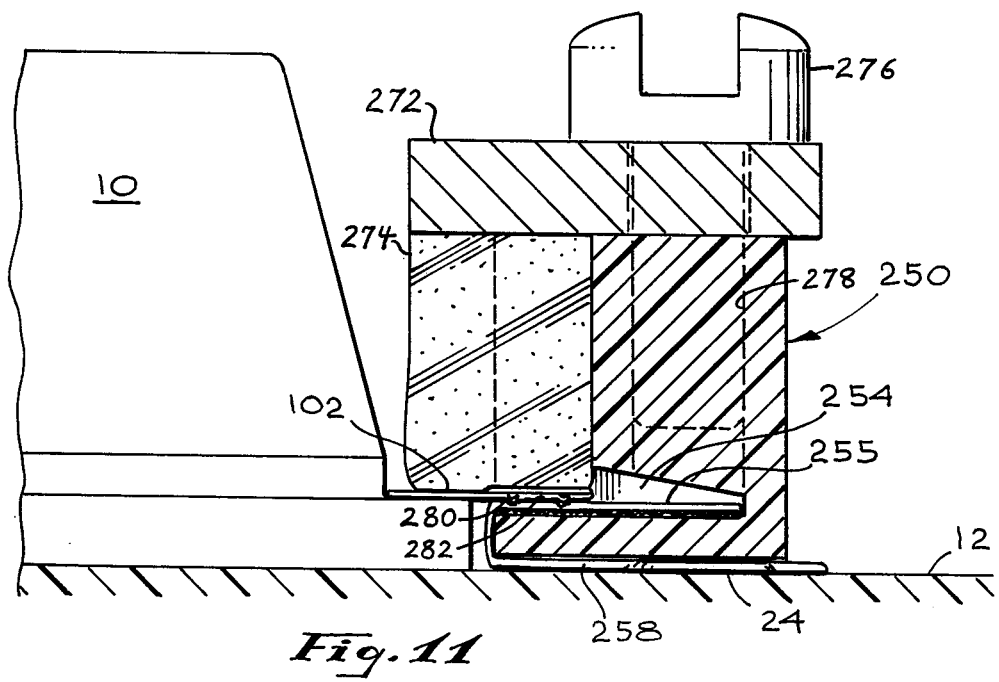
FIG. 11 is a partial sectional view of the connector assembly of FIG. 10, shown fully installed and connected to a microcircuit device.

FIGS. 9–11 illustrate a method for installing a connector assembly of another embodiment of the invention. The connector assembly includes anchor plates 250, 252 having notches 254 to provide a wide support surface or ledge 256 on which a group of leads 258 can be attached as by adhesive strips 260. The connector assembly can be installed by mounting the leads 258 on the ledge 256 of a corresponding anchor plate. The leads 258 can then be bent 90° so their outer ends lie at the position 262. Such bending can most easily be performed after adhesive mounting of the inner ends of the leads on the ledge, although bending can be performed prior to such mounting. With the leads bent and attached to the anchor plates 250, 252, the anchor plates are laid on the circuit board 12 as shown in FIGS. 9 and 10, with the ledges 256 extending substantially perpendicular to the upper surface of the circuit board, as seen in a sectional view. The outer ends 262 of the leads can then be joined to the circuit board pads 24 as by soldering. FIG. 9 shows a soldering fixture 264 which holds the anchor plates at the proper spacing during the soldering operation, this spacing being smaller than in the completed installation.

After the outer ends 262 of the leads are soldered to the printed circuit board pads 24, a layer of adhesive may be applied to surfaces 266 of each anchor plate. The anchor plates are swung in the direction of arrows 268, 270 by 90°, so that the ledges 256 on which the inner ends of the leads lie are largely parallel to the printed circuit board instead of perpendicular to it. FIG. 11 shows one of the anchor plates 250 after it has been swung by 90° to an outside position. The microcircuit device 10 then can be installed using contacts 102 to join the inner ends 255 of the leads that lie on the ledge 256, to corresponding pads on the microcircuit device 10.

The circuit device 10 can be installed by laying the contacts 102 in place and then installing a clamping plate 272 and an elastomeric block 274 bonded to the clamping plate at each anchor plate. The clamping plate 272 is installed by screwing a set of screws 276 into threaded holes 278 formed in the anchor plates to compress the block 274 against the contacts 102. This presses the contacts 102 against the pads of the circuit device 10 and the inner ends 255 of the leads. The contacts 102 and leads are formed with dimples 280, 282 that press into the leads and contacts to assure good electrical connection. It may be noted that the use of separate clamping plates 272 allows circuit devices of various lengths to be accommodated.

From the foregoing, it should be apparent that a pair of connector assembly embodiments have been disclosed herein for directly securing a leadless microcircuit device against a circuit board and for simultaneously forming electrical connections from the microcircuit device conductive pads to the circuit board conductive pads. Both embodiments can be inexpensively manufactured and yet assure long-term mechanical and electrical reliability. Additionally, both embodiments take up little space on the circuit board and define a low profile so as to permit adjacent circuit boards to be mounted close to one another. Moreover, the connector assemblies of both embodiments can be readily disassembled to allow easy replacement of the microcircuit devices.

Although particular embodiments of the invention have been described and illustrated herein, it is recognized that modifications and variations may readily occur to those skilled in the art, and consequently, it is intended that the claims be interpreted to cover such modifications and equivalents.

What is claimed is:

1. A connector assembly useful in combination with an integrated circuit device having a plurality of conductive pads arranged in a predetermined pattern on a substantially planar surface thereof for mounting and electrically connecting said device to a circuit board also having a plurality of conductive pads arranged in a predetermined pattern thereon, said connector assembly comprising:

a first contact bank comprised of a plurality of electrical contacts electrically connected to said circuit board pads;

a first elongated anchor plate secured to said circuit board physically engaging and supporting said first contact bank relative to said circuit board;

a second elongated anchor plate secured to said circuit board and spaced from said first anchor plate by a distance sufficient to accommodate said circuit device therebetween;

a second contact bank comprised of a plurality of elongated electrical contacts disposed so as to bridge the spacing between said first contact bank and said circuit device pads; and clamping means attachable to said first and second anchor plates for bearing against one of said contact banks to clamp said circuit device against said circuit board and to produce good electrical contact between said circuit board pads, said first contact bank, said second contact bank and said circuit device pads.

2. The assembly of claim 1 wherein said first contact bank is comprised of a plurality of parallel elongated electrically conductive contacts.

3. The assembly of claim 1 wherein said first contact bank comprises a sheet of flexible electrically insulative material carrying a plurality of parallel flat elongated electrically conductive contacts thereon.

4. The assembly of claim 3 wherein said first contact bank contacts extend beyond one edge of said sheet.

5. The assembly of claim 4 wherein the portions of said first contact bank contacts extending beyond the edge of said sheet are soldered to said circuit board pads.

6. The assembly of claim 1 wherein said first contact bank is comprised of a sheet of flexible electrically insulative material carrying a plurality of parallel flat elongated electrically conductive contacts on one surface thereof; and wherein said first anchor plate includes a contact support surface extending substantially parallel to said circuit board and supporting a second surface of said sheet proximate to a first end thereof to thus expose said one surface of said sheet and the contact portions therein proximate to said sheet first end;

said first contact bank further including portions of said contacts extending beyond a second end of said sheet soldered to said circuit board pads.

7. The assembly of claim 1 wherein said second contact bank comprises a sheet of flexible electrically insulative material carrying a plurality of parallel elongated electrically conductive contacts on one surface thereof.

8. The assembly of claim 6 wherein said second contact bank comprises a sheet of flexible electrically insulative material carrying a plurality of parallel elongated electrically conductive contacts on one surface thereof; and wherein said second contact bank sheet is supported with said one surface thereof in juxtaposition to said one surface of said first contact bank sheet and with the contacts on said second contact bank sheet engaging the contacts on said first contact bank sheet and said circuit device pads.

9. The assembly of claim 1 including raised areas of highly conductive maleable material formed on the contacts of at least one of said first and second contact banks.

10. The assembly of claim 8 including raised areas of highly conductive maleable material formed on the contacts of said second contact bank sheet.

11. The assembly of claim 1 wherein said clamping means includes first and second clamping members; and adjustable means for forcing said clamping members toward engagement with said first and second anchor plates.

12. The assembly of claim 11 wherein each of said clamping members includes a block of resilient material for bearing against one of said contact banks to urge it into engagement with both said circuit device pads and the other of said contact banks.

13. The assembly of claim 10 wherein said clamping means includes first and second clamping members; and adjustable means for forcing said clamping members toward engagement with said first and second anchor plates.

14. The assembly of claim 13 wherein each of said clamping members includes a block of resilient material for bearing against one of said contact banks to urge it inot engagement with both said circuit device pads and the other of said contact banks.

* * * * *